(12) United States Patent
Chevallier et al.

(10) Patent No.: US 10,347,328 B2
(45) Date of Patent: *Jul. 9, 2019

(54) SRAM WITH MULTIPLE POWER DOMAINS

(71) Applicant: Ambiq Micro, Inc., Austin, TX (US)

(72) Inventors: Christophe J. Chevallier, Palo Alto, CA (US); Scott Hanson, Austin, TX (US)

(73) Assignee: Ambiq Micro, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/049,078

(22) Filed: Jul. 30, 2018

(65) Prior Publication Data

US 2018/0336945 A1    Nov. 22, 2018

Related U.S. Application Data

(63) Continuation of application No. 15/345,229, filed on Nov. 7, 2016, now Pat. No. 10,062,431.

(51) Int. Cl.
| | |
|---|---|
| *G11C 7/00* | (2006.01) |
| *G11C 11/419* | (2006.01) |
| *G11C 11/418* | (2006.01) |
| *G11C 5/14* | (2006.01) |

(52) U.S. Cl.
CPC ............ *G11C 11/419* (2013.01); *G11C 5/147* (2013.01); *G11C 11/418* (2013.01)

(58) Field of Classification Search
CPC ....... G11C 5/147; G11C 5/14; G11C 11/4074; G11C 5/143
USPC .................................. 365/226, 154
See application file for complete search history.

(56) References Cited

U.S. PATENT DOCUMENTS

| | | | |
|---|---|---|---|
| 10,056,157 B1 * | 8/2018 | Yoko ..................... | G11C 17/16 |
| 10,062,431 B2 * | 8/2018 | Chevallier ............ | G11C 11/419 |

* cited by examiner

*Primary Examiner* — Son T Dinh
(74) *Attorney, Agent, or Firm* — Artie Pennington; Hunt Pennington Kumar & Dula PLLC

(57) ABSTRACT

An SRAM facility adapted to power an address path using a first developed supply voltage and to power a data path using a second developed supply voltage, the first and second developed power supplies being separate, distinct, and different. The SRAM facility includes a power supply facility or a voltage supply facility adapted to develop the first and second supply voltages.

20 Claims, 6 Drawing Sheets

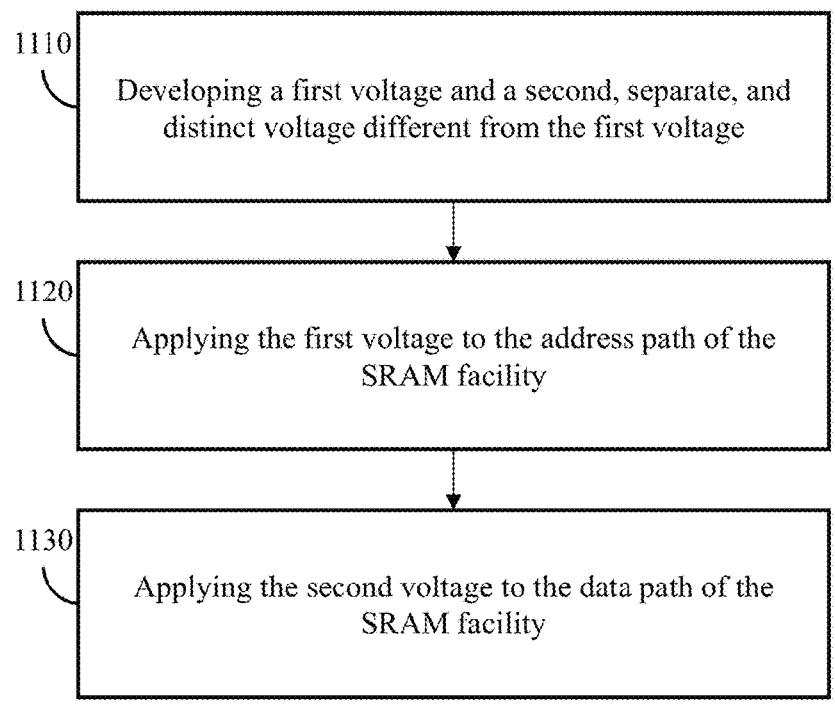
Fig. 11
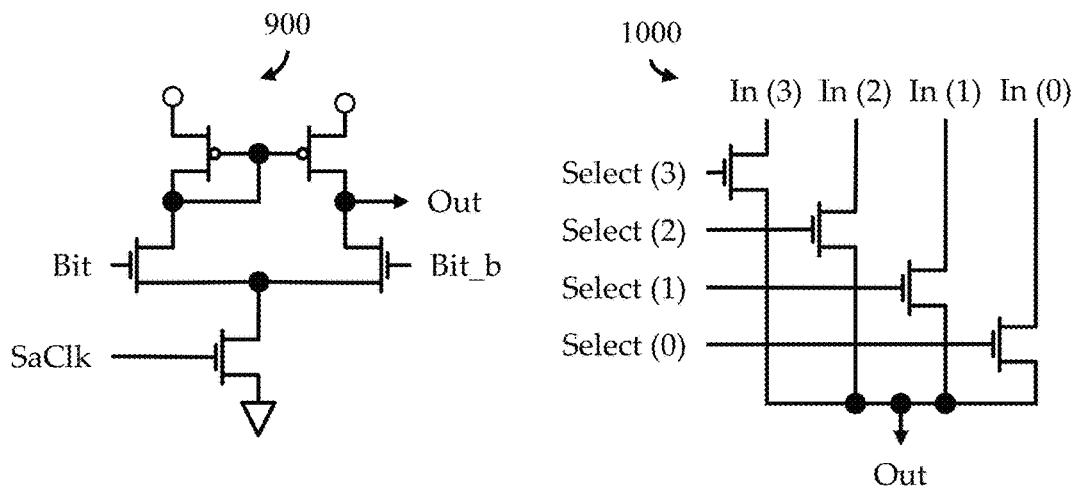
Fig. 9
Fig. 10

SRAM WITH MULTIPLE POWER DOMAINS

CROSS-REFERENCE TO RELATED APPLICATIONS

This application is a continuation of U.S. Non-Provisional patent application Ser. No. 15/345,229, filed 7 Nov. 2016 entitled SRAM with Multiple Power Domains (the "Parent Application").

This application claims priority to the Parent Application and hereby claims benefit of the filing date thereof pursuant to 37 C.F.R. § 1.78(a)(4).

The subject matter of the Parent Application is expressly incorporated herein by reference.

FIELD OF THE INVENTION

The present invention relates to low power semiconductor memory circuits and methods. More specifically, the present invention relates to Static Random Access Memory ("SRAM") circuits and methods having multiple power domains and reduced power requirements. The novel low power SRAM circuits and methods are suitable for use in low power microprocessors, microcontrollers, or power management devices.

BACKGROUND OF THE INVENTION

In general, in the descriptions that follow, the first occurrence of each special term of art that should be familiar to those skilled in the art of integrated circuits ("ICs") and systems will be italicized. In addition, when a term that may be new or that may be used in a context that may be new, that term will be set forth in bold and at least one appropriate definition for that term will be provided. In addition, throughout this description, the terms assert and negate may be used when referring to the rendering of a signal, signal flag, status bit, or similar apparatus into its logically true or logically false state, respectively, and the term toggle to indicate the logical inversion of a signal from one logical state to the other. Alternatively, the mutually exclusive boolean states may be referred to as logic_0 and logic_1. Of course, as is well known, consistent system operation can be obtained by reversing the logic sense of all such signals, such that signals described herein as logically true become logically false and vice versa. Furthermore, it is of no relevance in such systems which specific voltage levels are selected to represent each of the logic states.

Hereinafter, reference to a facility shall mean a circuit or an associated set of circuits adapted to perform a particular function regardless of the physical layout of an embodiment thereof. Thus, the electronic elements comprising a given facility may be instantiated in the form of a hard macro adapted to be placed as a physically contiguous module, or in the form of a soft macro the elements of which may be distributed in any appropriate way that meets speed path requirements. In general, electronic systems comprise many different types of facilities, each adapted to perform specific functions in accordance with the intended capabilities of each system. Depending on the intended system application, the several facilities comprising the hardware platform may be integrated onto a single IC, or distributed across multiple ICs. Depending on cost and other known considerations, the electronic components, including the facility-instantiating IC(s), may be embodied in one or more single- or multi-chip packages. However, unless expressly stated to the contrary, the form of instantiation of any facility shall be considered as being purely a matter of design choice.

Shown in FIG. 1 is a typical general purpose computer system 100. Although not all of the electronic components illustrated in FIG. 1 may be operable in the sub-threshold or near-threshold domains in any particular embodiment, some, at least, may be advantageously adapted to do so, with concomitant reductions in system power dissipation. In particular, in recently-developed battery powered mobile systems, such as smart-phones and the like, many of the discrete components typical of desktop or laptop devices illustrated in FIG. 1 are integrated into a single integrated circuit chip. Shown by way of example in FIG. 2 is a typical single-chip microcontroller unit ("MCU") 200 comprising: a central processing unit ("CPU"), at least one static random-access memory ("SRAM") facility 210,220, and a power supply 230.

SRAM circuits capable of storing digital information are widely used in a variety of mobile and handheld devices, e.g., smart phones, tablets, laptops, and other consumer electronics products. SRAM facilities may include, without limitation, stand-alone memory circuits, with a dedicated substrate, or embedded memory circuits, where the SRAM circuit shares a substrate with other electronic components.

Unlike flash or phase change memories, data storage in SRAM circuits requires continuous power. Typically, SRAM circuits are powered by a single power supply, e.g., a power source having only one power domain. Such a supply will power all SRAM sub-circuits, including, without limitation decoders, sense amplifiers (sense amps), write driver, and control logic. Additionally, one of ordinary skill in this art will appreciate that this supply can be used to create local, temporary voltages with a value different from the power supply.

A typical SRAM circuit performs two functions, a write operation and a read operation. During a write operation, an address and a data is asserted on the inputs of the SRAM, and the asserted data is written into the SRAM location provided by the asserted address. The state of the data written into the location specified by the address will remain static as long as the SRAM facility is powered appropriately, and so long as the location specified by given address is not rewritten with another data.

During a read operation, an address is asserted on the inputs of the SRAM facility and the data at the location specified by the asserted address will be asserted on the outputs of the SRAM circuit by the SRAM facility's internal circuitry. Internally to the SRAM facility, decoders will decode the address and select the appropriate array lines that will uniquely access a specific SRAM cell or cells. During a write operation, a write driver circuit will apply the input data to the line or lines selected by the decoders. During a read operation, a sense amplifier will read the data from the SRAM cell and subsequent circuitry will place the resulting logic data on the output of the SRAM circuit. Multiple data bits can be read simultaneously when multiple SRAM cells are selected and multiple sense amplifiers activated.

Switching all the necessary nodes to carry the address and data information within the SRAM circuit results in a significant power consumption. What is needed is an apparatus and method adapted to provide address and data selection within the SRAM while consuming less power than known prior art.

BRIEF SUMMARY OF THE INVENTION

In one embodiment, an SRAM facility having an address path facility and a data path facility. The SRAM facility includes a power supply facility adapted to develop a first voltage and a second voltage, the second voltage being different from the first voltage, the address path facility being adapted to receive the first voltage; and the data path facility being adapted to receive the second voltage.

In another embodiment, a method for operating an SRAM facility having an address path facility and a data path facility, the method comprising the steps of: (i) developing a first voltage and a second voltage, the second voltage being different from the first voltage; (ii) applying the first voltage to the address facility; and (iii) applying the second voltage to the data path facility.

In another embodiment, a method for operating an SRAM facility having an address path facility comprising a first power domain and a data path facility comprising a second power domain, the method comprising the steps of: (i) developing a first voltage and a second voltage; (ii) applying the first supply voltage to the first power domain to operate the address path facility; and (iii) applying the second supply voltage to the second power domain to operate the data path facility In another embodiment, a method comprising the steps of: (i) developing a power supply facility adapted to develop a first voltage and a second voltage; (ii) developing an SRAM facility comprising: (a) an address path facility adapted to operate using the first voltage; and (b) a data path facility adapted to operate using the second voltage.

In another embodiment, a method comprising the steps of: (i) developing an SRAM facility comprising: (a) an address path facility adapted to operate using a first voltage; and (b) a data path facility adapted to operate using a second voltage different from the first voltage.

In another embodiment, a method comprising the steps of: (i) developing a non-transitory, manufacturable design for an SRAM facility comprising: (a) an address path facility adapted to operate using a first voltage; and (b) an data path facility adapted to operate using a second voltage different from the first voltage.

BRIEF DESCRIPTION OF THE SEVERAL VIEWS OF THE DRAWINGS

FIG. 9 illustrates, in transistor schematic form, a typical sense amp configuration that may be utilized by SRAM facility of FIG. 4;

FIG. 10 illustrates, in transistor schematic form, a typical bit line mux that may be utilized by SRAM facility of FIG. 4; and FIG. 11 illustrates, in flow chart form, a method according to some embodiments.

Figure 1:
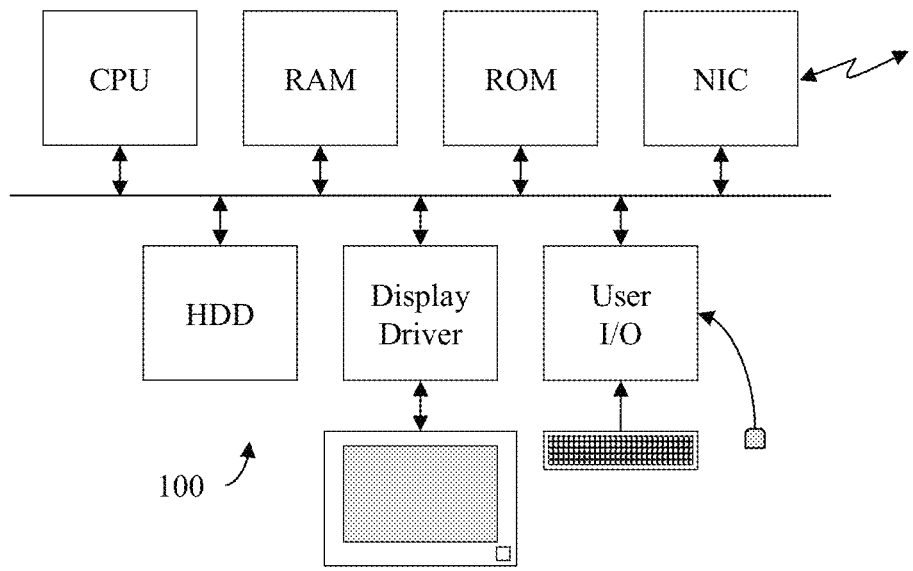
FIG. 1 illustrates, in block diagram form, a general purpose computer system adapted to instantiate any of the several embodiments.
Figure 2:
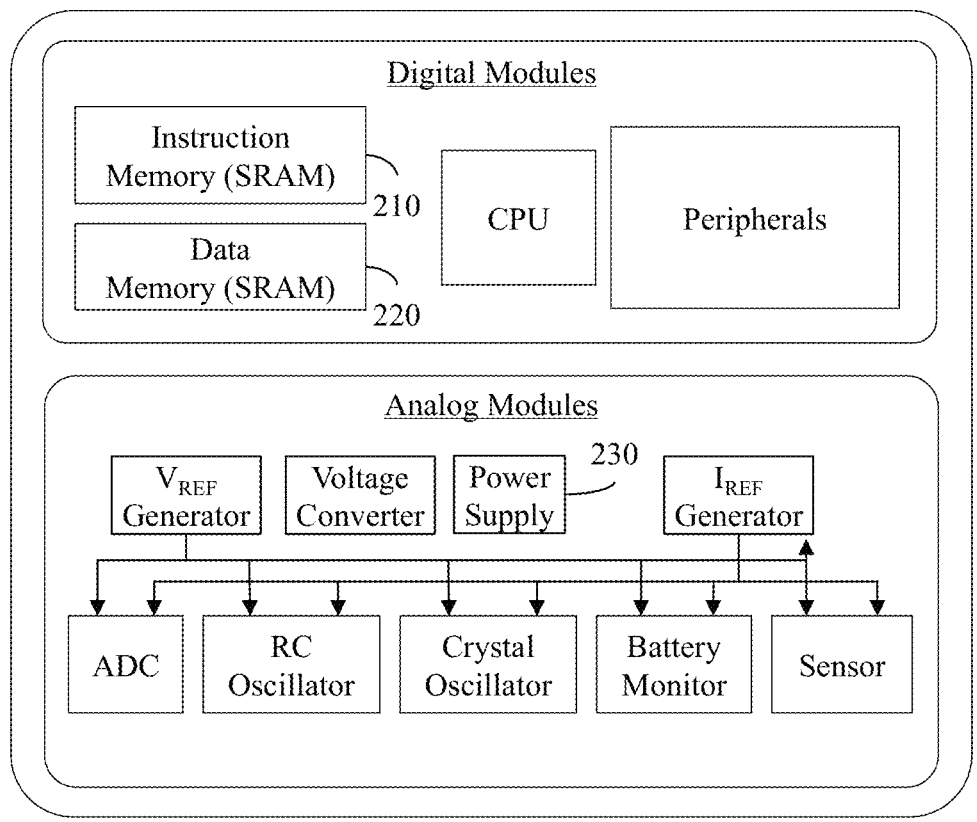
FIG. 2 illustrates, in block diagram form, a typical integrated system adapted to practice any of the several embodiments.

In the drawings, similar elements will be similarly numbered whenever possible. However, this practice is simply for convenience of reference and to avoid unnecessary proliferation of numbers, and is not intended to imply or suggest that identity is required in either function or structure in the several embodiments.

DETAILED DESCRIPTION

Figure 3:
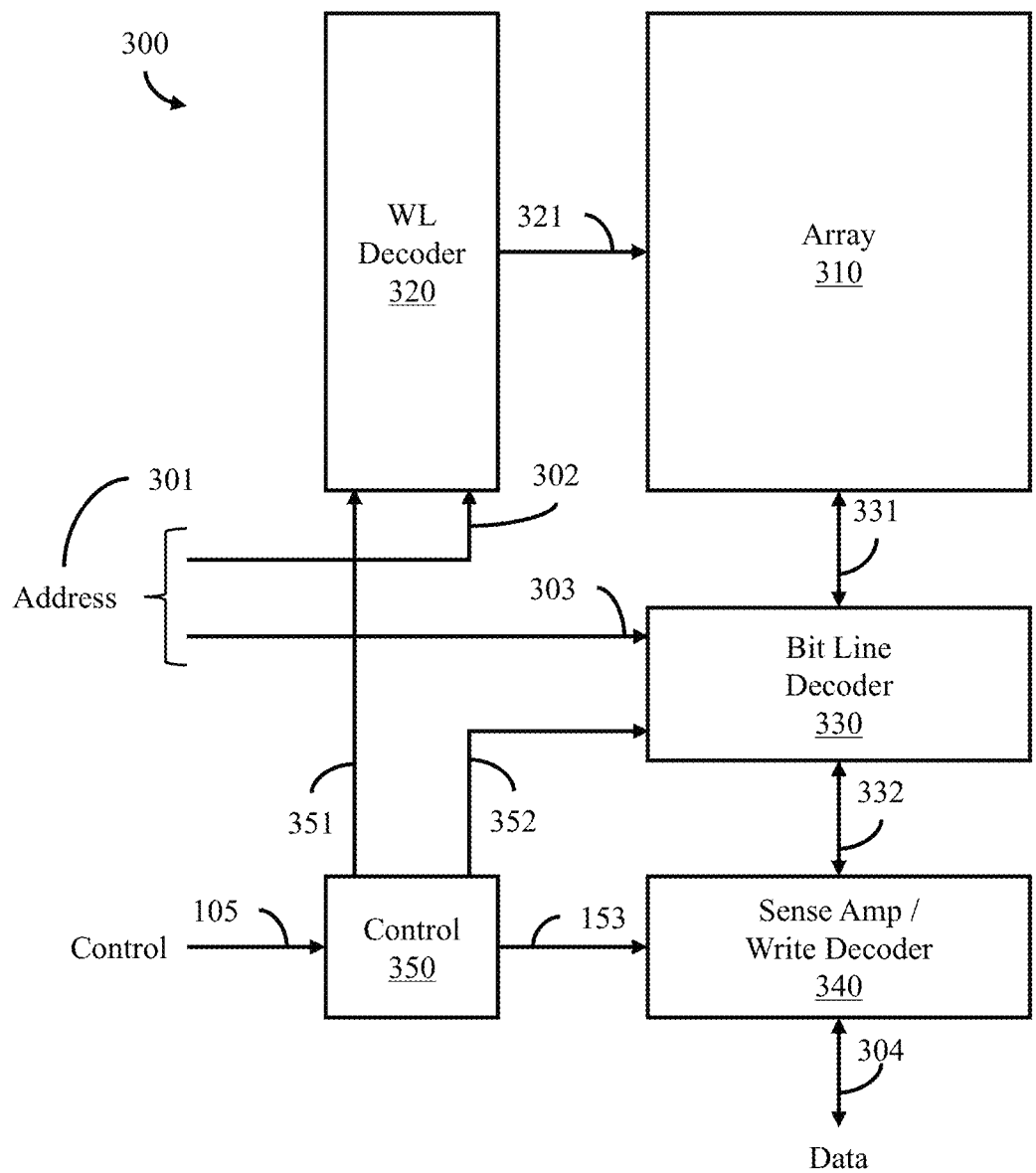
FIG. 3 illustrates, in block diagram form, a typical SRAM facility configuration.

FIG. 3 illustrates, in block diagram form, a typical SRAM facility 300 adapted to form a part of an electronic device such as MCU 200. Those skilled in the art of memory design will understand that the memory architecture is FIG. 3 is provided by way of example. In this example, SRAM facility 300 includes a memory array 310, a word line decoder 320, a bit line decoder 330, a sense amp and write decoder circuit 340, and control 350. As one skilled in the art would appreciate, memory array 310, while illustrated as a single array, may include multiple arrays or sub-arrays. Three signal busses, address bus 301, control bus 305, and data bus 304, respectively carry address, control and data signal between other electronic circuits and components of the electronic device 200 and the SRAM circuit 300. These circuits can be on a common semiconductor die, or provided as separate packaged components that are interconnected on a printed circuit board or other suitable substrate.

The address bus 301 is partitioned into row address bus 302 and column address bus 303. The word line or row decoder 320 decodes row address 302 and selects the specified word line 321 corresponding to the row address 302. Likewise, bit line decoder or column decoder 330 decodes column address 303 and selects the specified set of bit lines or columns 331 corresponding to column address 303. Sense amp and write decoder 340 reads data from selected bit lines 331 by way of signal bus 332 and drives the data read on to data 304. Likewise, sense amp and write decoder 340 drives value presented on data 304 onto selected bit line 331 by way of signal bus 332. Data bus 304 may include both input lines and output lines or, alternatively, may be multiplexed I/O lines. The control bus 305 provides information that includes, without limitation, whether the SRAM circuit performs a read operation, a write operation or remains idle.

Collectively, row address bus 302, and column address bus 303, along with word line decoder 320 represent the address path as would be understood by one of ordinary skill in the art of memory design. Collectively, data bus 304, sense amp and write decoder 340, signal bus 332, bit line decoder 330, bit lines 331 represent the data path as would be understood by one of ordinary skill in the art of memory design.

Power efficiency for the SRAM circuit may be improved by providing some of the sub-circuits of the SRAM facility 300 with a reduced supply or operating voltage. One means of reducing the power of the SRAM facility 300 is to selectively reduce the voltage of selected sub-circuits. By way of example, and without limitation, to improve overall power efficiency for the SRAM facility 300, one or more of: (i) the memory array 310 block; (ii) the word line decoder 320 block; (iii) the bit line decoder 330 block; (iv) the sense amp and write decoder circuit 340 block; or (v) the control block 350 may be have a supply voltage that is separate and distinct from the other blocks, i.e., the bit line decoder 330 block and the sense amp and write decoder circuit 340 block may have a first supply voltage, and the word line decoder 320 block may have a second supply voltage that is separate and distinct from the first voltage. As will be appreciated by one of ordinary skill in this art of memory design, various combinations exist without departing from the general structure described and illustrated herein.

Figure 4:
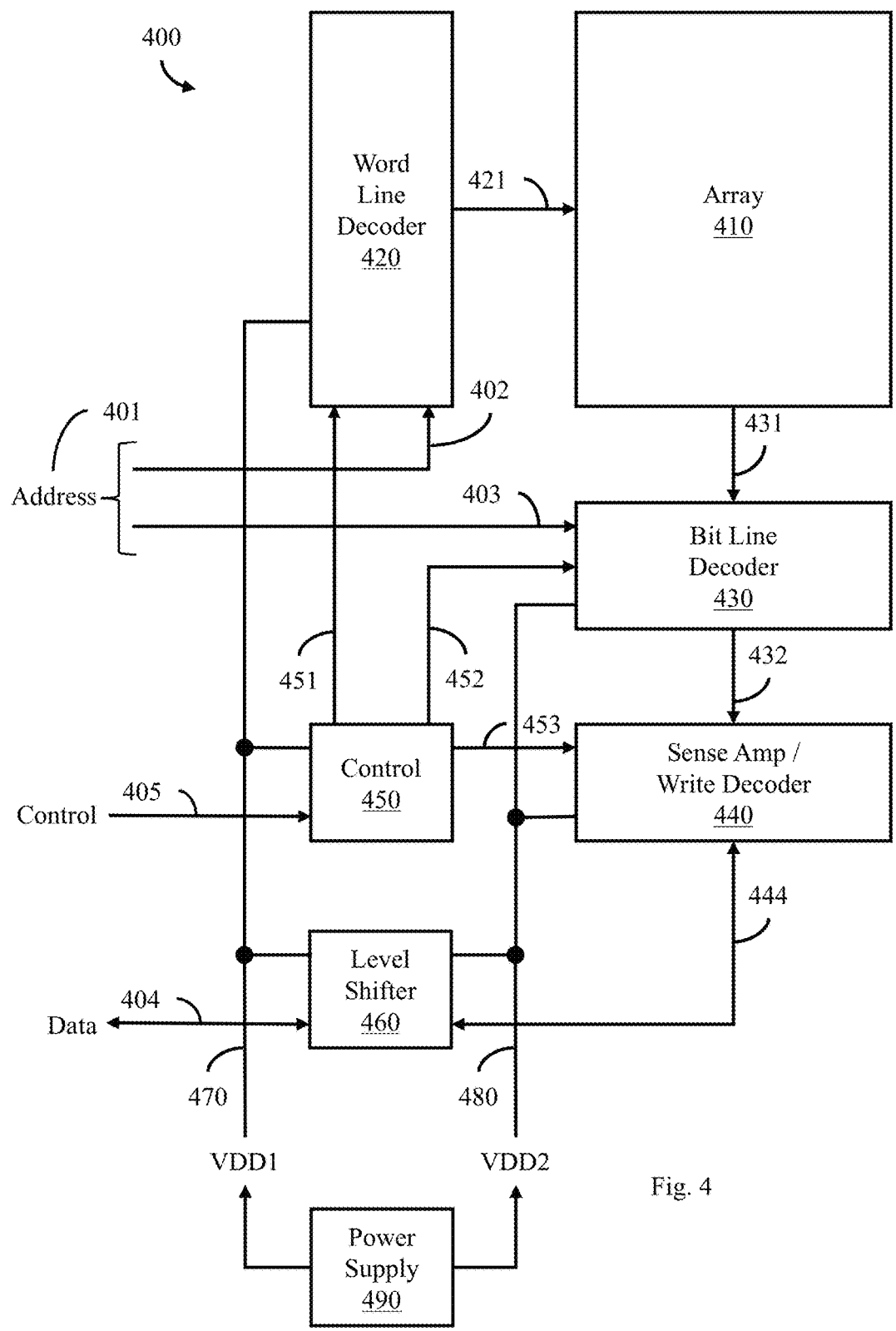
FIG. 4 illustrates, in block diagram form, an SRAM facility accordingly to one embodiment.

FIG. 4 illustrates, in block diagram form, an SRAM facility 400 accordingly to some embodiments and more specifically an example of how a power supply facility adapted to develop at least two different supply voltages domains, i.e., VDD1 470 and VDD2 480, each being distributed to an SRAM circuit by different distribution paths. As illustrated in FIG. 4, SRAM facility 400 includes a memory array 410, a word line decoder 420, a bit line decoder 430, a sense amp and write decoder circuit 440, and control 450. Additionally, SRAM facility 400 includes a level shifter 460 adapted to shift signal voltage levels between the two supply voltage domains VDD1 470 and VDD2 480. Power supply 490 provides the two supply voltages or power domains, i.e., VDD1 470 and VDD2 480. In this embodiment, and as discussed above, the voltage supply facility or power supply facility 490 provides two supply voltages, i.e., voltage supply line or VDD1 470 and voltage supply line or VDD2 480. As one of ordinary skill in this art would understand, power supply facility 490 may include a single power supply source developing two separate voltage supply lines or power supply facility 490 may include more than a single power supply source developing two separate voltage supply lines. Other embodiments are anticipated. In this exemplary embodiment, the address path facility, comprised of the word line decoder 420 and the control 450, is supplied by VDD1 470. The data path facility, comprised of the bit line decoder 430 and the sense amp and write decoder circuit 440, is supplied by VDD2 480. The level shifter 460 converts a signal on data bus 404 from the voltage level provided by VDD1 470 to the voltage level provided by VDD2 480, i.e., signal bus 444. Signals bus 432 and bit lines 431 will be supplied at the voltage level provided by VDD2 480. Control signals 452, 453 may also be converted to have logic level voltages provided by VDD2 480 voltage level.

Figure 5:
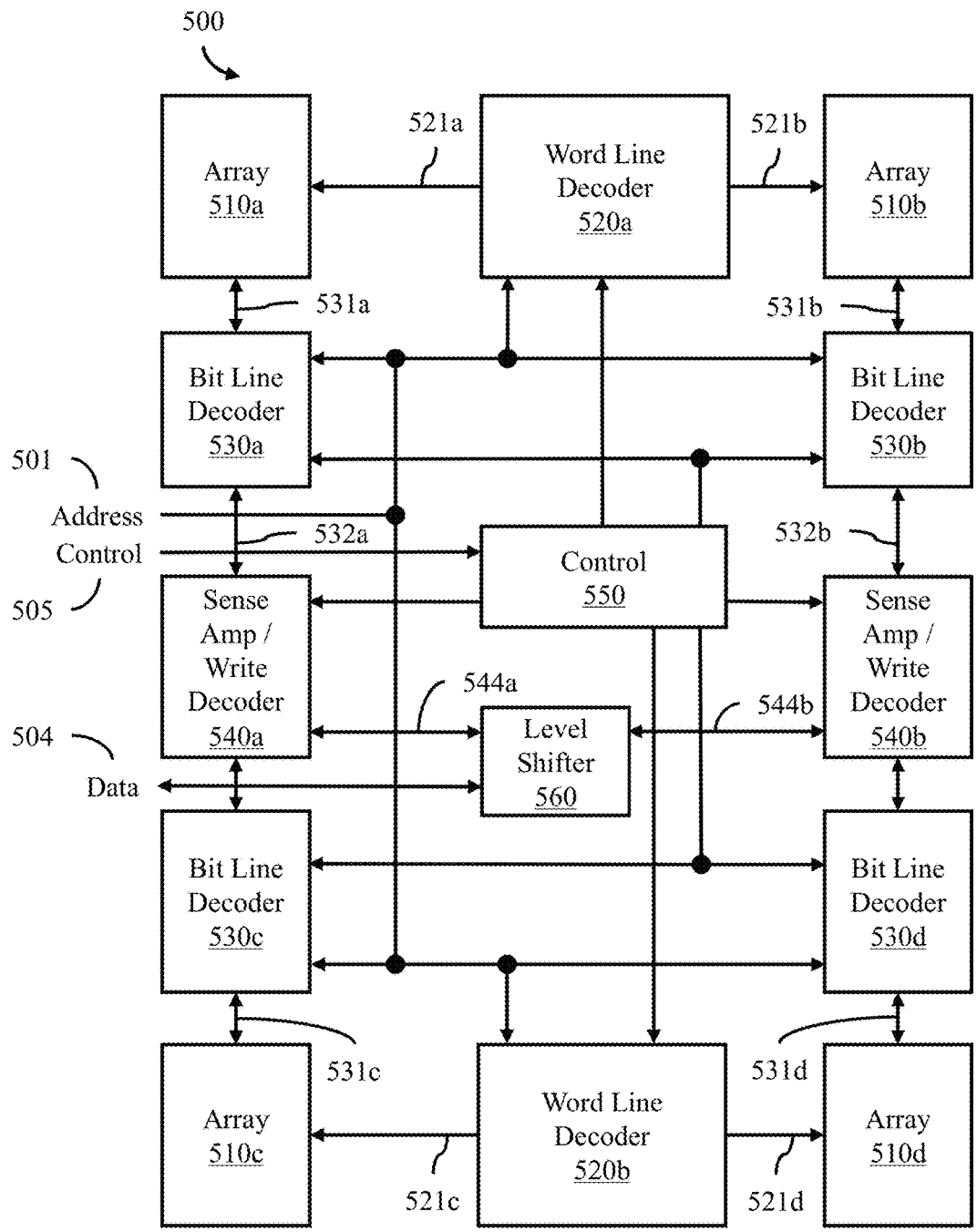
FIG. 5 illustrates, in block diagram form, a preferred placement for sub-circuits of the SRAM facility of FIG. 4.

FIG. 5 illustrates one example of a physical block placement for a physical implementation of the embodiment of FIG. 4. As illustrated, the SRAM array 410 of FIG. 4 is illustrated here in FIG. 5 as divided into a cluster array of four (4) memory array blocks, memory array 510a, memory array 510b, memory array 510c, and memory array 510d, physically configured to form a central region for physical placement of address path facility and data path facility circuit and logic blocks. Located within that central region is the bit line decoder 430. The bit line decoder 430 of FIG. 4 is illustrated here in FIG. 5 as divided into four (4) bit line decoder blocks, bit line decoder 530a, bit line decoder 530b, bit line decoder 530c, and bit line decoder 530d, each respectively located in the central region formed by the cluster array of four memory array blocks. Likewise, the word line decoder 420 of FIG. 4 is illustrated here in FIG. 5 as divided into two (2) decode blocks, word line decoder 520a and word line decoder 520b, each respectively located in the central region formed by the cluster array of four memory array blocks. The sense amp and write decoder 440 of FIG. 4 is illustrated here in FIG. 5 as divided into two (2) sense amp and write decode blocks, sense amp and write decoder 540a and sense amp and write decoder 540b, again, each respectively located in the central region formed by the cluster array of four memory arrays. Referring to FIG. 4, data bus 404 is converted by level shifter 460 to a level shifted bus 444. Referring back to FIG. 5, data bus 504 is converted by level shifter 560, located in the central region, to a level shifted bus 544a, 544b. By physically placing the physical blocks of circuits such as control facility 550, bit line decoder 530a, bit line decoder 530b, bit line decoder 530c, bit line decoder 530d, word line decoder 520a, and word line decoder 520b, at or near the physical center of the physical implantation of SRAM facility 500, capacitance on the internal buses and signals can be significantly reduced, i.e., bit lines 531a, 531b, 531c, 531d, buses 532a, 532b, 532c, 532d, and word lines 521a, 521b, 521c, 521d. Using this physical placement, power consumption may be further reduced by only activating a single set of signals to a single memory array to operate the single memory array during a selected memory read or memory write operation. Other embodiments may comprise a cluster array of two (2) memory array blocks physically configured to form a central region for physical placement of address path and data path facilities, or may comprise a cluster of six (6) memory array blocks physically configured to form a central region for physical placement of address path and data path facilities. Other embodiments are anticipated.

A further advantage of using multiple power domains can be provided by use of transistor types adapted to each domain. Typically, SRAM circuits are built using MOS transistors. MOS transistors have a gate, a source, a drain and a bulk node. By applying a voltage on the gate the amount of current that can flow from the drain to the source can be modulated. One of the main characteristics of MOS transistors is its threshold voltage. This quantity, in its simplest definition, substantially is the voltage applied on its gate in order to pass current. With a sufficiently high supply voltage, circuitry can be build using high threshold voltage devices. The advantage of a high threshold voltage device is that when its gate is turned off, the leakage from drain to source is very low, and the device consumes very little power. However, this high threshold voltage device cannot be used efficiently with a low supply voltage, because the signal developed in the circuitry under low supply is not high enough to let the high threshold voltage device pass a large amount of current, and therefore achieve proper switching speed. When proper switching speed is needed in a circuit with a low supply, low threshold voltage devices can be used.

Figure 6:
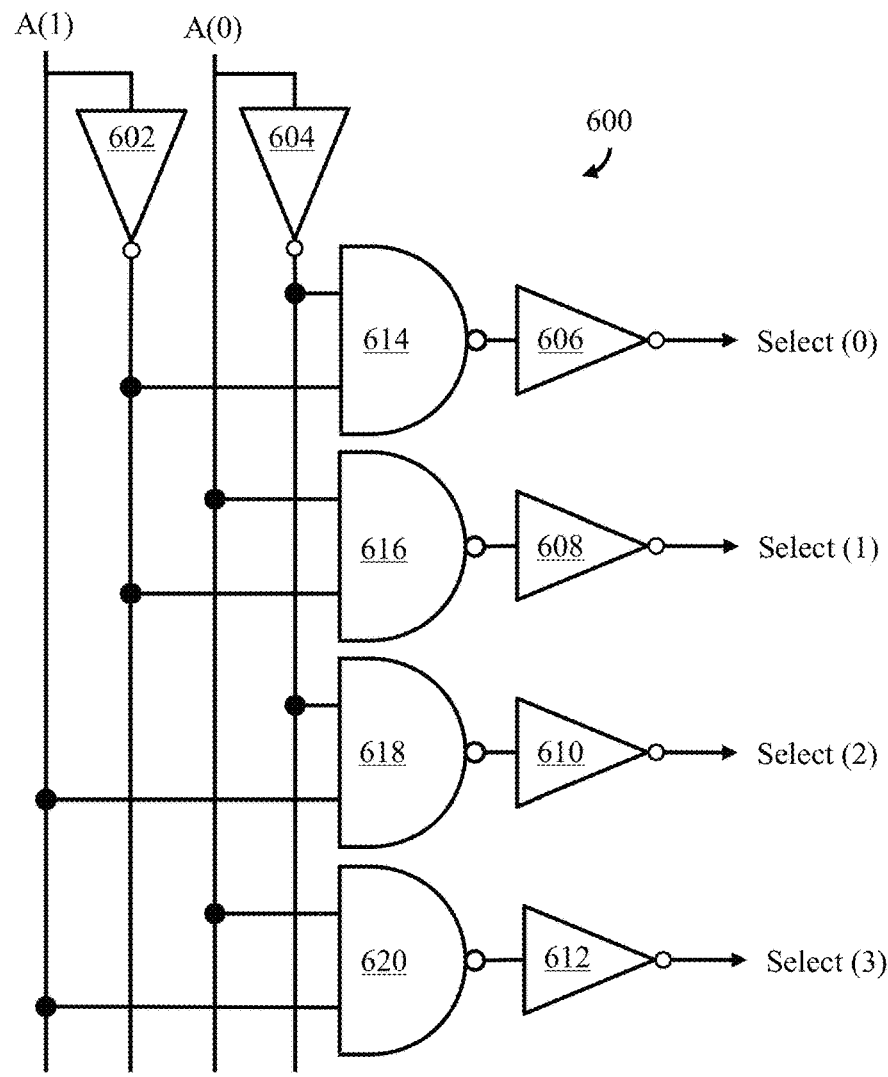
FIG. 6 illustrates, in schematic form, a decoder circuit 600 according to some embodiments.

SRAM facility 400 comprises decoder circuits that may be used in the address path facility to decode a portion of the incoming address data on row address 402 and ultimately provide a row select signal, also known as a word line signal. SRAM facility 400 also comprises decoder circuits that may also be used in the data path facility to decode a portion of the incoming address data on column address bus 403 and ultimately provide a column select signal. By way of example, FIG. 6 illustrates, in schematic form, a decoder circuit 600 according to some embodiments. In this example, decoder circuit 600 is a 2-to-4 line binary decoder that includes an array of inverters and NAND gates. Specifically, decoder circuit 600 includes inverters 602, 604, 606, 608, 610, and 612, and also includes NAND gates 614, 616, 618, and 620. As in well understood by one of ordinary skill in this art of logic design, the two binary inputs, A(1) and A(0), are decoded into one of four outputs, i.e., Select (3:0), each output representing one of the minterms of the 2 input variable.

Figure 7:
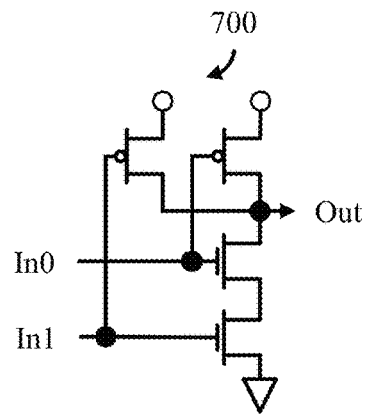
FIG. 7 illustrates, in transistor schematic form, a typical CMOS NAND gate.
Figure 8:
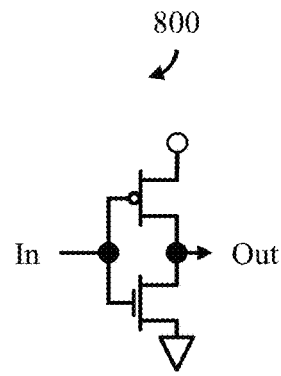
FIG. 8 illustrates, in transistor schematic form, a typical CMOS inverter.

FIG. 7 illustrates, in transistor schematic form, a typical CMOS NAND gate 700. FIG. 8 illustrates, in transistor schematic form, a typical CMOS inverter 800. As discussed earlier, the transistors of these circuits may be of various types available in the target process technology, i.e., high-threshold voltage transistors, low-threshold voltage transistors, etc., and would be well understood by one of ordinary skill in this art of logic and circuit design.

SRAM facility 400 comprises sense amps and bit line mux, as illustrated in FIG. 4, each making up a portion of the data path facility. FIG. 9 illustrates, in transistor schematic form, a typical sense amp 900 configuration that may be utilized by SRAM facility 400 of FIG. 4. As is known, data voltage values stored in a selected memory cell are received through the bit line mux of FIG. 10 by sense amp 900 and, upon assertion of the sense amp clock to a logic_1 value, here labeled SaClk, the sense amp 900 will output a value indicative of the stored value. FIG. 10 illustrates, in transistor schematic form, a typical bit line mux 1000 that may be utilized by SRAM facility 400 of FIG. 4.

Advantageously, because of the use of a lower supply voltage in the data path, the SRAM circuit active power, which is the sum of the power of all nodes switching, is reduced. It is to be noted that not all portions of the data path need to be in the low power domain to achieve a power reduction.

FIG. 11 illustrates, in flow chart form, a method according to some embodiments.

According to this exemplary method, the method includes an initial step of developing a first voltage and a second voltage that is separate, different, and distinct from the first voltage, i.e., referring to FIG. 4, VDD1 470 and VDD2 480 (see, step 1110). By way of example, power supply 490 of FIG. 4 may supply at least the two voltages, VDD1 470 and VDD2 480. Referring back to FIG. 11, the first supply voltage, or power domain, is used to power the address path (see, step 1120). The second supply voltage is used to power the data path (see, step 1130). Various embodiments will be apparent to one of ordinary skill in the art without departing from the spirit or scope.

It will be apparent to those skilled in the art that various modifications and variations can be made without departing from the spirit or scope of the invention. Thus, it is intended that the disclosed embodiments cover modifications and variations that come within the scope of the claims that eventually issue in a patent(s) originating from this application and their equivalents. In particular, it is explicitly contemplated that any part or whole of any two or more of the embodiments and their modifications described above can be combined in whole or in part.

What is claimed is:

1. A method for operating an SRAM facility having an address path facility and a data path facility, said method comprising the steps of:
    developing a first operating supply voltage and a second operating supply voltage, said second operating supply voltage being different from said first operating supply voltage;
    applying said first operating supply voltage to said address path facility, said address path facility further comprising a first transistor adapted to operate at said first operating supply voltage; and
    applying said second operating supply voltage to said data path facility, said data path facility further comprising a second transistor adapted to operate at said second operating supply voltage.

2. The method of claim 1 wherein said first transistor is further characterized as a high-threshold voltage transistor.

3. The method of claim 2 wherein said first operating supply voltage is further characterized as being higher than said second operating supply voltage.

4. The method of claim 2 wherein said second transistor is further characterized as a low-threshold voltage transistor.

5. The method of claim 4 wherein said first operating supply voltage is further characterized as being higher than said second operating supply voltage.

6. The method of claim 1 wherein said second transistor is further characterized as a low-threshold voltage transistor.

7. The method of claim 6 wherein said first operating supply voltage is further characterized as being higher than said second operating supply voltage.

8. A method for operating an SRAM facility having an address path facility comprising a first power domain and a data path facility comprising a second power domain, said method comprising the steps of:
    developing a first operating supply voltage and a second operating supply voltage;
    applying said first operating supply voltage to said first power domain to operate said address path facility, said address path facility further comprising a first transistor adapted to operate at said first operating supply voltage; and
    applying said second operating supply voltage to said second power domain to operate said data path facility, said data path facility further comprising a second transistor adapted to operate at said second operating supply voltage.

9. The method of claim 8 wherein said first operating supply voltage is further characterized as being different from said second operating supply voltage.

10. The method of claim 9 wherein said first operating supply voltage is further characterized as being higher than said second operating supply voltage.

11. An SRAM facility configured to perform the steps of a method according to claim 1.

12. A memory system comprising an SRAM facility according to claim 11.

13. A non-transitory computer readable medium including executable instructions which, when executed in a processing system, causes the processing system to perform the steps of a method according to claim 1.

14. A memory facility comprising:
    a power supply facility adapted to develop a first operating supply voltage and a second operating supply voltage, said second operating supply voltage being different from said first operating supply voltage;
    an address path facility adapted to:
        receive an m-bit address;
        receive said first operating supply voltage, said address path facility further comprising a first transistor adapted to operate at said first operating supply voltage; and
        develop a plurality of word-line signals as a function of said m-bit address;
    a data path facility adapted to:
        receive a first plurality of data signals;
        receive said second operating supply voltage, said data path facility further comprising a second transistor adapted to operate at said second operating supply voltage; and
        develop a plurality of bit line data signals as a function of said first plurality of data signals; and
    a memory array facility adapted to:
        receive said plurality of word-line signals; and
        receive said plurality of bit line data signals.

15. The memory facility of claim 14 wherein said first transistor is further characterized as a high-threshold transistor.

16. The memory facility of claim 15 wherein said first operating supply voltage is further characterized as being higher than said second operating supply voltage.

17. The memory facility of claim 15 wherein said second transistor is further characterized as a low-threshold transistor.

18. The memory facility of claim 17 wherein said first operating supply voltage is further characterized as being higher than said second operating supply voltage.

19. The memory facility of claim 14 wherein said second transistor is further characterized as a low-threshold transistor.

20. The memory facility of claim 19 wherein said first operating supply voltage is further characterized as being higher than said second operating supply voltage.

* * * * *